US011686002B2

(12) United States Patent
Wada et al.

(10) Patent No.: US 11,686,002 B2
(45) Date of Patent: Jun. 27, 2023

(54) METHOD FOR MANUFACTURING RUTHENIUM WIRING

(71) Applicant: TOKYO OHKA KOGYO CO., LTD., Kawasaki (JP)

(72) Inventors: Yukihisa Wada, Kawasaki (JP); Shinya Koga, Kawasaki (JP); Kazuhiro Takahashi, Kawasaki (JP); Natsumi Okawa, Kawasaki (JP); Daijiro Mori, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 0 days.

(21) Appl. No.: 17/444,513

(22) Filed: Aug. 5, 2021

(65) Prior Publication Data

US 2022/0049361 A1 Feb. 17, 2022

(30) Foreign Application Priority Data

Aug. 11, 2020 (JP) ................................. 2020-135864

(51) Int. Cl.

| | |
|---|---|
| ***C23F 1/38*** | (2006.01) |
| ***C23F 1/26*** | (2006.01) |
| ***C23F 1/28*** | (2006.01) |
| ***C09K 13/00*** | (2006.01) |
| ***C09K 13/06*** | (2006.01) |
| ***C09K 13/04*** | (2006.01) |
| ***C23F 1/00*** | (2006.01) |
| ***C23F 1/14*** | (2006.01) |
| ***H01L 21/306*** | (2006.01) |
| ***H01L 21/48*** | (2006.01) |

(52) U.S. Cl.

CPC ................ *C23F 1/38* (2013.01); *C09K 13/00* (2013.01); *C09K 13/04* (2013.01); *C09K 13/06* (2013.01); *C23F 1/00* (2013.01); *C23F 1/14* (2013.01); *C23F 1/26* (2013.01); *C23F 1/28* (2013.01); *H01L 21/30604* (2013.01); *H01L 21/4892* (2013.01)

(58) Field of Classification Search

None

See application file for complete search history.

(56) References Cited

U.S. PATENT DOCUMENTS

2019/0385906 A1 12/2019 Aizawa et al.
2022/0119960 A1* 4/2022 Mizutani ............... H01L 21/768

FOREIGN PATENT DOCUMENTS

| | | | | |
|---|---|---|---|---|
| JP | 2009081247 | * 4/2009 | ................ C23F 1/30 |
| JP | 2016-092101 A | 5/2016 | |
| JP | 2019-220690 A | 12/2019 | |
| WO | WO 2016/068183 A1 | 5/2016 | |

* cited by examiner

*Primary Examiner* — Jiong-Ping Lu

(74) *Attorney, Agent, or Firm* — Knobbe, Martens, Olson & Bear, LLP

(57) ABSTRACT

A method for manufacturing a ruthenium wiring including (i) treating a metal surface including ruthenium using a first chemical solution including a compound having a functional group capable of coordinating to a ruthenium atom, and (ii) carrying out an etching treatment on the metal surface including ruthenium treated with the first chemical solution, using a second chemical solution.

7 Claims, 2 Drawing Sheets

METHOD FOR MANUFACTURING RUTHENIUM WIRING

BACKGROUND OF THE INVENTION

Field of the Invention

The present invention relates to a method for manufacturing a ruthenium wiring. Priority is claimed on Japanese Patent Application No. 2020-135864, filed in Japan on Aug. 11, 2020, the contents of which are incorporated herein by reference.

Description of Related Art

In the early steps of manufacturing steps of semiconductor elements, steps of forming a metal wiring on a wafer surface include middle end of the line (MOL) and back end of the line (BEOL). In MOL, plugs are formed, and in BEOL, metal wiring, vias, and the like are formed. In recent years, in the manufacturing of semiconductor elements and liquid crystal display elements, advances in lithographic techniques have created a rapid increase in pattern miniaturization. Along with the miniaturization of wiring patterns, it has become difficult to secure sufficient alignment margins, causing problems such as resistance fluctuation and deterioration of reliability.

As a countermeasure to secure alignment margins, a method was developed in which a metal wiring is selectively etched and retracted after chemical mechanical polishing (CMP), the method being referred to as fully self-aligned via (FSAV) (for example, Japanese Unexamined Patent Application, First Publication No. 2019-220690).

Copper, tungsten, cobalt, and the like have been used as wiring materials; however, along with the miniaturization of patterns, the use of ruthenium or molybdenum with lower resistance is being investigated. In a case where FSAV is applied to form a ruthenium wiring, it is necessary to etch ruthenium (Ru) to form recesses. As a method for etching ruthenium, for example, an etching method using an etching solution including orthoperiodic acid as an oxidizing agent was proposed (PCT International Publication No. WO2016/68183 and Japanese Unexamined Patent Application, First Publication No. 2016-92101).

SUMMARY OF THE INVENTION

In a case of forming fine ruthenium wiring patterns by applying FSAV or the like, there is a demand to further increase the precision of the etching techniques. However, when ruthenium etching is performed by related art wet etching methods such as described in PCT International Publication No. WO2016/68183 or Japanese Unexamined Patent Application, First Publication No. 2016-92101, intergranular corrosion may be generated and roughness control may be difficult.

The present invention was made in consideration of the above circumstances and has an object of providing a method for manufacturing a ruthenium wiring which is able to obtain a ruthenium wiring with reduced surface roughness while maintaining a good etching rate.

In order to solve the problems described above, the present invention adopts the following configurations.

A first aspect of the present invention is a method for manufacturing a ruthenium wiring, the method including (i) treating a metal surface including ruthenium using a first chemical solution including a compound having a functional group capable of coordinating to a ruthenium atom, and (ii) carrying out an etching treatment on the metal surface including ruthenium treated with the first chemical solution, using a second chemical solution.

According to the present invention, it is possible to provide a method for manufacturing a ruthenium wiring which is able to obtain a ruthenium wiring with reduced surface roughness while maintaining a good etching rate.

DETAILED DESCRIPTION OF THE INVENTION

Figure 1:
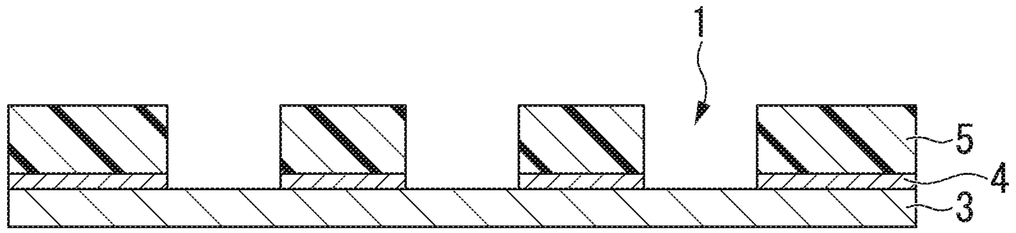
FIG. 1 is a schematic diagram illustrating an example of a step of a method for manufacturing a ruthenium wiring to which it is possible to apply the method of one embodiment of the present invention.

A detailed description will be given below of embodiments of the present invention, with reference to the drawings according to the case. In the drawings, the same or corresponding reference numerals are attached to the same or corresponding portions and overlapping explanations thereof may not be included. Regarding the dimensional ratios in each drawing, portions are exaggerated for the sake of explanation and do not necessarily correspond to the actual dimensional ratios.

(Method for Manufacturing Ruthenium Wiring)

A method for manufacturing a ruthenium wiring according to one embodiment of the present invention includes (i) treating a metal surface including ruthenium using a first chemical solution including a compound having a functional group capable of coordinating to a ruthenium atom (step (i)), and (ii) carrying out an etching treatment on the metal surface including ruthenium treated with the first chemical solution, using a second chemical solution (step (ii)).

[Step (i)]

In step (i), a metal surface including ruthenium is treated using a first chemical solution including a compound having a functional group capable of coordinating to a ruthenium atom.

<<Metal Surface Including Ruthenium>>

A metal surface including ruthenium is used for the formation of a ruthenium wiring. The metal surface including ruthenium may be, for example, the surface of a ruthenium-containing layer formed on a substrate.

The substrate is not particularly limited and examples thereof include various substrates such as a semiconductor wafer, a glass substrate for a photomask, a glass substrate for a liquid crystal display, a glass substrate for a plasma display, a substrate for a field emission display (FED), a substrate for an optical disc, a substrate for a magnetic disk, and substrate for a magneto-optical disc. As the substrate, a substrate used for semiconductor device production is preferable. In addition to the ruthenium-containing layer and the base material of the substrate, the substrate may have various layers and structures as appropriate, for example, metal wiring, a gate structure, a source structure, a drain structure, an insulating layer, a ferromagnetic layer, a non-magnetic layer, and the like. The size, thickness, shape, layer structure, and the like of the substrate are not particularly limited and appropriate selection according to the purpose is possible.

In the method of the present embodiment, a ruthenium-containing layer is preferably present in the uppermost layer of the device surface of the substrate. The ruthenium-containing layer is preferably a layer containing a ruthenium metal, and more preferably a ruthenium metal film. The thickness of the ruthenium-containing layer on the substrate is not particularly limited and appropriate selection according to the purpose is possible. Examples of the thickness of the ruthenium-containing layer include a range of 0.1 nm to 500 nm and 0.1 nm to 100 nm.

The method for forming the ruthenium-containing layer on the substrate is not particularly limited and it is possible to use known methods. Examples of such methods include a sputtering method, a chemical vapor deposition (CVD) method, a physical vapor deposition (PVD) method, an atomic layer deposition (ALD) method, and the like. The raw material of the ruthenium-containing layer used when forming the ruthenium-containing layer on the substrate is also not particularly limited and appropriate selection thereof is possible according to the film forming method.

<First Chemical Solution>

The first chemical solution contains a compound having a structure including a functional group capable of coordinating to a ruthenium atom (also referred to below as “component (A1)”).

<<Component (A1)>>

Component (A1) has a structure including a functional group capable of coordinating to a ruthenium atom. Such functional groups include, for example, a group including a nitrogen-containing heterocyclic ring, a phosphono group, and the like.

Examples of the nitrogen-containing heterocyclic ring include a triazole ring, an imidazole ring, a pyridine ring, a phenanthroline ring, a tetrazole ring, a pyrazole ring, a pyrimidine ring, and the like, without being limited thereto. In addition, nitrogen-containing heterocyclic compounds including a nitrogen-containing heterocyclic ring also encompass compounds formed of a plurality of rings, such as benzotriazole and adenine. Specific examples of nitrogen-containing heterocyclic compounds including a nitrogen-containing heterocyclic ring are shown below, without being limited thereto.

Examples of compounds including a triazole ring include triazoles such as 1,2,3-triazole, 1,2,4-triazole, 3-amino-1H-1,2,4-triazole, 1-acetyl-1H-1,2,3-triazolo[4,5-b]pyridine, 1H-1,2,3-triazolo[4,5-b]pyridine, 1,2,4-triazolo[4,3-a]pyridin-3(2H)-one, and 3H-1,2,3-triazolo[4,5-b]pyridin-3-ol; benzotriazoles such as 1,2,3-benzotriazole, 5-methyl-1H-benzotriazole, 1-hydroxybenzotriazole, 1-dihydroxypropylbenzotriazole, 2,3-dicarboxypropylbenzotriazole, 4-hydroxybenzotriazole, 4-carboxyl-1H-benzotriazole, 4-carboxyl-1H-benzotriazole methyl ester, 4-carboxyl-1H-benzotriazole butyl ester, 4-carboxyl-1H-benzotriazole octyl ester, 5-hexylbenzotriazole, [1,2,3-benzotriazolyl-1-methyl][1,2,4-triazolyl-1-methyl][2-ethylhexyl]amine, triltriazole, naphthotriazole, bis[(1-benzotriazolyl)methyl]phosphonic acid, 3-aminotriazole, and the like. Among the above, 1,2,4-triazole, 1,2,3-benzotriazole, and 5-methyl-1H-benzotriazole are preferable.

Examples of compounds including an imidazole ring include imidazoles such as 2-methylimidazole, 2-ethylimidazole, 2-isopropylimidazole, 2-propylimidazole, 2-butylimidazole, 4-methylimidazole, 2,4-dimethylimidazole, 2-ethyl-4-methylimidazole, 2-undecylimidazole, and 2-aminoimidazole; biimidazoles such as 2,2'-biimidazole; and the like. Among the above, biimidazoles are preferable, and 2,2'-biimidazole is more preferable.

Examples of compounds containing a pyridine ring include pyridines such as 1H-1,2,3-triazolo[4,5-b]pyridine, 1-acetyl-1H-1,2,3-triazolo[4,5-b]pyridine, 3-aminopyridine, 4-aminopyridine, 3-hydroxypyridine, 4-hydroxypyridine, 2-acetamidopyridine, 4-pyrrolidinopyridine, and 2-cyanopyridine; bipyridyls such as 2,2'-bipyridyl, 4,4'-dimethyl-2,2'-bipyridyl, 4,4'-di-tert-butyl-2,2'-bipyridyl, and 4,4-dinonyl-2,2-bipyridyl; and the like. Among the above, bipyridyls are preferable and 2,2'-bipyridyl, 4,4'-dimethyl-2,2'-bipyridyl, 4,4'-di-tert-butyl-2,2'-bipyridyl, and 4,4-dinonyl-2,2-bipyridyl are more preferable.

Examples of compounds including a phenanthroline ring include 1,10-phenanthroline, and the like.

Examples of compounds including a tetrazole ring include 1H-tetrazole, 5-amino-1H-tetrazole, 5-methyl-1H-tetrazole, 5-phenyl-1H-tetrazole, 1-(2-diaminoethyl)-5-mercaptotetrazole, and the like.

Examples of compounds including a pyrazole ring include 3,5-dimethylpyrazole, 3-amino-5-methylpyrazole, 4-methylpyrazole, 3-amino-5-hydroxypyrazole, and the like.

Examples of compounds including a pyrimidine ring include pyrimidine, 1,2,4-triazolo[1,5-a]pyrimidine, 1,3,4,6,7,8-hexahydro-2H-pyrimido[1,2-a]pyrimidine, 1,3-diphenyl-pyrimidine-2,4,6-trione, 1,4,5,6-tetrahydropyrimidine, 2,4,5,6-tetraaminopyrimidine sulfate, 2,4,5-trihydroxypyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxylpyrimidine, 2,4-diaminopyrimidine, 2-acetamidopyrimidine, 2-aminopyrimidine, 2-methyl-5,7-diphenyl-(1,2,4)triazolo(1,5-a)pyrimidine, 2-methylsulfanyl-5,7-diphenyl-(1,2,4)triazolo(1,5-a)pyrimidine, 2-methylsulfanyl-5,7-diphenyl-4,7-dihydro-(1,2,4)triazolo(1,5-a)pyrimidine, 4-aminopyrazolo[3,4-d]pyrimidine, and the like.

Among the above, as nitrogen-containing heterocyclic compounds, compounds including a triazole ring, compounds including an imidazole ring, compounds including a pyridine ring, and compounds including a phenanthroline ring are preferable.

Examples of a compound including a phosphono group include an organic phosphonic acid. The organic group of the organic phosphonic acid is not particularly limited and examples thereof include a hydrocarbon group having 1 to 30 carbon atoms which may have a substituent group. The hydrocarbon group may be an aliphatic hydrocarbon group or an aromatic hydrocarbon group.

The aliphatic hydrocarbon group may be saturated or unsaturated, but is preferably saturated. The aliphatic hydrocarbon group may be linear, branched chain, or include a ring structure.

As a linear aliphatic hydrocarbon group, for example, 1 to 30 carbon atoms are preferable, 1 to 25 carbon atoms are more preferable, and 1 to 20 carbon atoms are even more preferable.

As a branched-chain aliphatic hydrocarbon group, for example, 3 to 30 carbon atoms are preferable, 3 to 25 carbon atoms are more preferable, and 3 to 20 carbon atoms are even more preferable.

As a cyclic aliphatic hydrocarbon group, for example, 3 to 30 carbon atoms are preferable, 3 to 25 carbon atoms are more preferable, and 3 to 20 carbon atoms are even more preferable. The cyclic hydrocarbon group may be monocyclic or polycyclic. Examples of aliphatic hydrocarbon groups which are monocyclic groups include groups from which one hydrogen atom is removed from a monocycloalkane, and groups in which one of the hydrogen atoms of the monocycloalkane is substituted with a linear or branched-chain alkylene group. The polycyclic aliphatic hydrocarbon group includes a group from which one hydrogen atom is removed from a polycycloalkane, a group in which one of the hydrogen atoms of the polycycloalkane is substituted with a linear or branched-chain alkylene group, and the like.

An aromatic hydrocarbon group is a hydrocarbon group having at least one aromatic ring. The aromatic ring is not particularly limited as long as the ring is a cyclic conjugated ring with $4n+2$ π-electrons and may be monocyclic or polycyclic. The number of carbon atoms in the aromatic ring is preferably 5 to 30, more preferably 5 to 20 carbon atoms, even more preferably 6 to 15 carbon atoms, and particularly preferably 6 to 12 carbon atoms.

Specific examples of aromatic rings include aromatic hydrocarbon rings such as benzene, naphthalene, anthracene, and phenanthrene; aromatic heterocyclic rings in which some of the carbon atoms forming the aromatic hydrocarbon rings are substituted with heteroatoms. Examples of the heteroatoms in the aromatic heterocyclic ring include oxygen atoms, sulfur atoms, nitrogen atoms, and the like. Specific examples of aromatic heterocyclic rings include pyridine rings, thiophene rings, and the like.

Examples of the aromatic hydrocarbon group include a group from which one hydrogen atom is removed from the aromatic hydrocarbon ring or aromatic heterocyclic ring (aryl group or heteroaryl group); a group from which one hydrogen atom is removed from an aromatic compound including two or more aromatic rings (for example, biphenyl, fluorene, and the like); a group in which one of the hydrogen atoms of the aromatic hydrocarbon ring or aromatic heterocyclic ring is substituted with an alkylene group (for example, aryl alkyl groups such as a benzyl group, a phenethyl group, a 1-naphthylmethyl group, a 2-naphthylmethyl group, a 1-naphthylethyl group, and a 2-naphthylethyl group, or the like), and the like. The number of carbon atoms of the alkylene group bonded to the aromatic hydrocarbon ring or aromatic heterocyclic ring is preferably 1 to 4, 1 to 2 carbon atoms is more preferable, and 1 carbon atom is particularly preferable.

Among the above, as organic phosphonic acids, phosphonic acids having a saturated aliphatic hydrocarbon group or an aromatic hydrocarbon group as an organic group are preferable, and alkylphosphonic acid or phenylphosphonic acid is more preferable. As the alkylphosphonic acids, 5 to 20 carbon atoms are preferable. Specific examples of alkylphosphonic acids include octylphosphonic acid, dodecylphosphonic acid, octadecylphosphonic acid, and the like.

Component (A1) may be used alone, or two or more may be used in combination.

The content of the component (A1) in the first chemical solution is not particularly limited and is, for example, 0.001% by mass to 5% by mass with respect to the total mass of the first chemical solution, 0.005% by mass to 3% by mass is preferable, 0.01% by mass to 2% by mass is more preferable, and 0.02% by mass to 1.0% by mass is even more preferable.

<<Solvent: Component (S)>>

It is possible to produce the first chemical solution by dissolving the component (A1) in a solvent (also referred to below as "component (S)"). The solvent is not particularly limited as long as it is possible to dissolve the component (A1) and form a uniform solution. It is possible to appropriately select the solvent according to the type of component (A1). For example, when the component (A1) is water-soluble, it is possible to select an aqueous solvent (for example, water). In addition, when the component (A1) is lipophilic, it is possible to select an organic solvent.

In a case where the solvent is an aqueous solvent, the solvent may be water or an aqueous solution in which any components are dissolved in water. The aqueous solvent is preferably water. As water, water subjected to a purification treatment such as distilled water, ion-exchange water, and ultrapure water is preferable, and it is more preferable to use ultrapure water generally used in semiconductor manufacturing.

In a case where the solvent is an organic solvent, it is possible to use any organic solvent generally used in semiconductor processes without being particularly limited. Examples of organic solvents include lactones such as γ-butyrolactone; ketones such as acetone, methyl ethyl ketone, cyclohexanone, methyl-n-pentyl ketone, methyl isopentyl ketone, and 2-heptanone; mono alcohols such as methanol, ethanol, n-propanol, isopropanol, n-butanol, sec-butanol, t-butanol, n-pentanol, 4-methyl-2-pentanol (methylisobutylcarbinol), and 2-methylbutyl alcohol; polyhydric alcohols such as ethylene glycol, diethylene glycol, propylene glycol, and dipropylene glycol; compounds having ester bonds such as ethylene glycol monoacetate, diethylene glycol monoacetate, propylene glycol monoacetate, and dipropylene glycol monoacetate, derivatives of polyhydric alcohols such as compounds having ether bonds such as monoalkyl ethers such as monomethyl ether, monoethyl ether, monopropyl ether, and monobutyl ether, or monophenyl ether, of compounds having the polyhydric alcohols or the ester bonds [among the above, propylene glycol monomethyl ether acetate (PGMEA) and propylene glycol monomethyl ether (PGME) are preferable]; cyclic ethers such as dioxane, esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethyl benzyl ether, cresyl methyl ether, diphenyl ether, dibenzyl ether, phenetol, butyl phenyl ether, ethyl benzene, diethylbenzene, pentylbenzene, isopropylbenzene, toluene, xylene, cymene, and mesitylene, dimethyl sulfoxide (DMSO), and the like.

Component (S) may be used alone, or two or more may be used in combination.

<<Optional Component>>

The first chemical solution may include other optional components in addition to the component (A1) and the component (S) described above. The optional components are not particularly limited as long as the effects of the present invention are not impaired. Examples of optional components include pH adjusters, surfactants, and the like.

pH Adjuster

The first chemical solution may include a pH adjuster for the purpose of adjusting the pH of the chemical solution. It is possible to use acidic compounds or alkaline compounds as pH adjusters.

Examples of acidic compounds include inorganic acids such as hydrochloric acid, sulfuric acid, and nitric acid, and salts thereof, or organic acids such as acetic acid, lactic acid, oxalic acid, tartaric acid, and citric acid, salts thereof, and the like.

As alkaline compounds, it is possible to use organic alkaline compounds and inorganic alkaline compounds.

Examples of organic alkaline compounds include quaternary ammonium salts such as organic quaternary ammonium hydroxides, alkyl amines such as trimethylamine and triethylamine, salts of derivatives thereof, and the like.

Specific examples of organic quaternary ammonium hydroxides include tetramethylammonium hydroxide (TMAH), bis(2-hydroxyethyl)dimethylammonium hydroxide, tetraethylammonium hydroxide (TEAH), tetrapropylammonium hydroxide, tetrabutylammonium hydroxide, methyltriethylammonium hydroxide, trimethyl (hydroxyethyl) ammonium hydroxide, triethyl (hydroxyethyl) ammonium hydroxide, and the like.

Examples of inorganic alkaline compounds include ammonia, ammonium salts, inorganic compounds including alkali metals or alkaline earth metals, salts thereof, and the like. Examples of inorganic alkaline compounds include lithium hydroxide, sodium hydroxide, potassium hydroxide, rubidium hydroxide, cesium hydroxide, and the like.

A pH adjuster may be used alone, or two or more may be used in combination.

Surfactant

The first chemical solution may include a surfactant for the purpose of adjusting the wettability, or the like. As the surfactant, it is possible to use a nonionic surfactant, an anionic surfactant, a cationic surfactant, or an amphoteric surfactant, and the above may be used in combination.

Examples of nonionic surfactants include polyalkylene oxide alkylphenyl ether surfactants, polyalkylene oxide alkyl ether surfactants, block polymer surfactants formed of polyethylene oxide and polypropylene oxide, polyoxyalkylene distyrenated phenyl ether surfactants, polyalkylene tribenzylphenyl ether surfactants, acetylene polyalkylene oxide surfactants, and the like.

Examples of anionic surfactants include alkyl sulfonic acid, alkyl benzene sulfonic acid, alkyl naphthalene sulfonic acid, alkyl diphenyl ether sulfonic acid, fatty acid amide sulfonic acid, polyoxyethylene alkyl ether carboxylic acid, polyoxyethylene alkyl ether acetic acid, polyoxyethylene alkyl ether propionic acid, alkylphosphonic acid, fatty acid salts, and the like. Examples of "salts" include ammonium salt, sodium salt, potassium salt, tetramethylammonium salt, and the like.

Examples of cationic surfactants include a quaternary ammonium salt surfactant, an alkyl pyridium surfactant, and the like.

Examples of amphoteric surfactants include betaine surfactants, amino acid surfactants, imidazoline surfactants, amine oxide surfactants, and the like.

These surfactants are generally commercially available. A surfactant may be used alone or two or more may be used in combination.

It is possible to perform the treatment of a metal surface including ruthenium by a first chemical solution by bringing the first chemical solution into contact with the metal surface. Examples of such methods include a spray method, an immersion method, a liquid filling method, or the like, without being limited thereto. In the spray method, for example, an object to be treated having a metal surface including ruthenium is transported or rotated in a predetermined direction and the first chemical solution is sprayed into the space to bring the first chemical solution into contact with the metal surface including ruthenium. As necessary, the first chemical solution may be sprayed on the metal surface including ruthenium while rotating the object to be treated using a spin coater.

In the immersion method, the object to be treated having a metal surface including ruthenium is immersed in the first chemical solution to bring the first chemical solution into contact with the metal surface.

In the liquid filling method, the first chemical solution is filled on the metal surface including ruthenium and the metal surface and the first chemical solution are brought into contact.

It is possible to appropriately select these methods according to the structure, materials, and the like of the object to be treated. In the case of the spray method or the liquid filling method, the amount of the first chemical solution supplied to the object to be treated may be an amount which is sufficient to wet the metal surface including ruthenium, which is the treatment target, with the first chemical solution.

The temperature at which the treatment is performed with the first chemical solution is not particularly limited. Examples of the treatment temperature include 10° C. to 60° C. A treatment temperature of 20° C. to 60° C. is preferable, 25° C. to 60° C. is more preferable, and 25° C. to 55° C. is even more preferable. Normally, when the treatment temperature is higher, it is possible to further suppress an increase in roughness due to the etching treatment described below, but the etching rate will decrease. By setting the treatment temperature in the above preferable ranges, it is possible to make both the roughness and etching rate good.

The treatment time is not particularly limited and may be a time which is sufficient for the reaction of the component (A1) with ruthenium. Examples of the treatment time include 30 seconds or more and 40 seconds or more is preferable, and 50 seconds or more is even more preferable. The upper limit of the treatment time is not particularly limited and examples thereof include 10 minutes or less, 5 minutes or less is preferable, and 3 minutes or less is even more preferable.

By treating a metal surface including ruthenium with a first chemical solution containing the component (A1), the component (A1) coordinates to ruthenium and a thin film of the component (A1) is formed on the metal surface.

After treating the metal surface including ruthenium with the first chemical solution, the metal surface may be cleaned with a cleaning solution such as water as appropriate. Due to this, it is possible to remove the first chemical solution from the metal surface. It is possible to perform the cleaning by bringing the metal surface into contact with the cleaning solution. Examples of such methods are the same as the methods listed for making contact with the first chemical solution.

[Step (ii)]

In step (ii), the metal surface including ruthenium treated with the first chemical solution is subjected to an etching treatment using the second chemical solution.

<Second Chemical Solution>

The second chemical solution is a chemical solution for carrying out an etching treatment on ruthenium and is a ruthenium etching solution. As the second chemical solution, it is possible to use a known ruthenium etching solution without being particularly limited and examples of the second chemical solution include a chemical solution including an oxidizing agent such as orthoperiodic acid ($H_5IO_6$).

<Oxidizing Agent>

It is possible to make ruthenium soluble by oxidization. Therefore, the second chemical solution preferably includes an oxidizing agent. Examples of oxidizing agents include periodic acid, hypochlorous acid, chlorous acid, hypobromous acid, transition metal oxides, peroxides, cerium ammonium nitrate, nitrates, nitrites, iodic acid, iodates, periodates, perchlorates, persulfuric acid, persulfuric acid salts, peracetic acid, peracetic acid salts, permanganate compounds, bichromate compounds, and the like.

Among the above, the oxidizing agent is preferably periodic acid. Examples of periodate include orthoperiodic acid, sodium orthoperiodic acid, meta-periodate, sodium metaperiodate, and the like, and orthoperiodic acid is preferable. Orthoperiodic acid is an oxidizing agent which releases oxygen atoms for oxidizing ruthenium. The redox potential of orthoperiodic acid is a potential sufficient to oxidize and dissolve ruthenium, thus, it is possible to efficiently oxidize and dissolve ruthenium.

An oxidizing agent may be used alone, or two or more may be used in combination.

It is possible to appropriately set the content of the oxidizing agent in the second chemical solution according to the type of oxidizing agent. Examples of the content of the oxidizing agent include 0.05% by mass to 10% by mass with respect to the total mass of the second chemical solution.

In a case where the second chemical solution includes orthoperiodic acid as an oxidizing agent, the content of orthoperiodic acid is not particularly limited, but an example thereof is 0.05% by mass to 8% by mass with respect to the total mass of the second chemical solution, preferably 0.07% by mass to 7% by mass, more preferably 0.08% by mass to 5.0% by mass, and even more preferably 0.1% by mass to 3.0% by mass. When the content of orthoperiodic acid is in the above range, the etching rate with respect to ruthenium is further improved.

<<pH Adjuster>>

The second chemical solution may include a pH adjuster for the purpose of adjusting the pH. Examples of the pH adjuster include the same pH adjusters as listed above for the first chemical solution. Ammonia is preferable as the pH adjuster in the second chemical solution from the viewpoint of improving the etching rate with respect to ruthenium.

A pH adjuster may be used alone or two or more may be used in combination, but it is preferable to use ammonia alone.

The pH adjuster is preferably added such that the pH of the second chemical solution is 3 pH or higher. From the viewpoint of obtaining a good etching rate, the second chemical solution is preferably pH 4 or higher, more preferably 4.5 or higher, even more preferably 5 or higher, and particularly preferably 5.5 or higher. In addition, from the viewpoint of suppressing the generation of ruthenium tetroxide, pH 8 or higher is preferable. Ruthenium tetroxide is produced in the process of etching ruthenium and, since ruthenium tetroxide is toxic, it is desirable to reduce the generation thereof. Setting the second chemical solution to pH 8 or higher makes it possible to reduce the risk of ruthenium tetroxide generation.

From the viewpoint of the etching rate, the upper limit value of the pH of the second chemical solution is pH 12 or lower and pH 11 or lower is preferable, pH 10 or lower is more preferable, and pH 9.5 or lower is even more preferable. Examples of the preferable range of pH of the second chemical solution include pH 8 or higher and 10 or lower and pH 8 or higher and 9.5 or lower is preferable.

The value of pH is a value measured by a pH meter under normal temperature (23° C.) and normal pressure (1 atm) conditions.

<<Water>>

The second chemical solution preferably includes water as a solvent. The water may include trace components which are inevitably mixed in. The water used in the second chemical solution is preferably water subjected to a purification treatment such as distilled water, ion-exchange water, and ultrapure water, and it is more preferable to use ultrapure water generally used in semiconductor manufacturing.

The water content in the second chemical solution is not particularly limited, but 80% by mass or more is preferable, 90% by mass or more is more preferable, and 94% by mass or more is even more preferable. In addition, the upper limit value is not particularly limited, but less than 99.95% by mass is preferable, 99.9% by mass or less is more preferable, and 99.8% by mass or less is even more preferable.

<<Other Components>>

The second chemical solution may include other components in addition to the above components. Examples of the other components include water-soluble organic solvents, surfactants, oxidizing agents, and the like. The second chemical solution preferably does not include slurries, such as those used in chemical mechanical polishing (CMP) processes, and preferably does not include abrasives, such as metal oxide particles.

Water-Soluble Organic Solvent

The second chemical solution may contain a water-soluble organic solvent in a range in which the effect of the present invention is not impaired.

Examples of the water-soluble organic solvent include alcohols (for example, 2-methyl-2-propanol, methanol, ethanol, ethylene glycol, propylene glycol, glycerin, 1,3-propanediol, 1,3-butanediol, 1,4-butanediol, diethylene glycol, dipropylene glycol, furfuryl alcohol, 2-methyl-2,4-pentanediol, and the like), dimethyl sulfoxide, ethers (for example, ethylene glycol dimethyl ether, diethylene glycol dimethyl ether, triethylene glycol dimethyl ether, tetraethylene glycol dimethyl ether, and propylene glycol dimethyl ether), and the like.

In a case where the second chemical solution includes a water-soluble organic solvent, the content of the water-soluble organic solvent is preferably 50% by mass or less with respect to the total of the amount of water and the amount of the water-soluble organic solvent, 30% by mass or less is more preferable, and 10% by mass or less is even more preferable.

Surfactant

The second chemical solution may include a surfactant for the purpose of adjusting the wettability to the object to be treated or the like. Examples of the surfactant include the same surfactants as listed above in the first chemical solution.

It is possible to perform the etching treatment of a metal surface including ruthenium by the second chemical solution by bringing the second chemical solution into contact with the metal surface. The method is not particularly limited and it is possible to use a known etching method. Examples of methods include the same methods listed above as the methods for bringing the first chemical solution into contact with the metal surface including ruthenium. That is, examples include a spray method, an immersion method, a liquid filling method, and the like, without being limited thereto.

It is possible to appropriately select the etching treatment method according to the structure, material, and the like of the object to be treated. In the case of the spray method or the liquid filling method, the amount of the etching solution supplied to the object to be treated may be an amount which sufficiently wets the metal surface including ruthenium, which is the treatment target, with the second chemical solution.

The temperature at which the etching treatment is performed is not particularly limited as long as the ruthenium is dissolved with the second chemical solution. Examples of the temperature for the etching treatment include 20° C. to 60° C. In a case of any of the spray method, the immersion method, and the liquid filling method, the etching rate is increased by increasing the temperature of the etching solution, but it is possible to appropriately select the treatment temperature in consideration of suppressing composition changes in the second chemical solution to be small, or workability, safety, cost, and the like.

The time for performing the etching treatment may be appropriately selected according to the amount of ruthenium to be removed by the etching (for example, the thickness of the ruthenium-containing layer, the amount of ruthenium deposits, and the like), and the etching treatment conditions. From the viewpoint of suppressing an increase in roughness due to etching, examples of the etching treatment time include 10 minutes or less. For the etching treatment time, 5 minutes or less is preferable, 3 minutes or less is more preferable, and 2 minutes or less is even more preferable. The lower limit of the etching treatment time is not particularly limited, as long as the etching of ruthenium progresses in the time and examples thereof include 3 seconds or more. As the lower limit of the etching treatment time, for example, 4 seconds or more is preferable, and 5 seconds or more is more preferable.

Carrying out an etching treatment on the metal surface including ruthenium with a second chemical solution after step (i) above makes it possible to reduce an increase in roughness due to etching. It is presumed this is because a thin film of the component (A1) is formed on the metal surface including ruthenium by step (i) and thus the generation of intergranular corrosion by etching is suppressed.

After carrying out an etching treatment on the metal surface including ruthenium with the second chemical solution, the metal surface may be cleaned with a cleaning solution such as water as appropriate. Due to this, it is possible to remove the second chemical solution from the metal surface. It is possible to perform the cleaning by bringing the metal surface into contact with the cleaning solution. Examples of such methods are the same as the methods listed for making contact with the first chemical solution.

[Repetition of Cycle of Step (i) and Step (ii)]

In the method for manufacturing a ruthenium wiring of the present embodiment, the cycle of step (i) and step (ii) above may be repeated two or more times. The number of repetitions of the cycle of step (i) and step (ii) is not particularly limited and it is possible to repeat step (i) and step (ii) until the desired amount of ruthenium is removed. By performing etching while repeating the cycles of step (i) and step (ii), it is possible to etch the desired amount of ruthenium while suppressing an increase in roughness. It is possible to appropriately set the number of cycles depending on the amount of etching, for example, 2 to 10 times, 2 to 8 times, 2 to 6 times, 2 to 5 times, or the like.

[Optional Steps]

The method for manufacturing a ruthenium wiring of the present embodiment may include an optional step in addition to step (i) and step (ii) above. Examples of optional steps include a step of pre-cleaning the metal surface including ruthenium (pre-cleaning step) before step (i), and the like.

<Pre-Cleaning Step>

The method for manufacturing a ruthenium wiring of the present embodiment may include a pre-cleaning step before step (i). By performing the pre-cleaning step, it is possible to remove dirt and the like present on the metal surface and to favorably perform the treatment by step (i).

The pre-cleaning solution used in the pre-cleaning step is, for example, a chemical solution including an oxidizing agent. Examples of the oxidizing agent include the same oxidizing agents as listed above for the second chemical solution.

The pre-cleaning solution may be the same as the second chemical solution described above or may be the second chemical solution diluted with water or the like.

<Other Optional Steps>

The method for manufacturing a ruthenium wiring of the present embodiment may include optional steps other than the pre-cleaning step. It is possible for the optional steps to include any known step performed when forming a ruthenium wiring without being particularly limited. Examples of the steps include a step for forming each structure such as a gate structure, a source structure, a drain structure, an insulating layer, a ferromagnetic layer, and a non-magnetic layer (layer formation, etching other than the etching treatment described above, chemical mechanical polishing, modification, and the like), a resist film formation step, an exposure step, a development step, a heating treatment step, a cleaning step, an inspection step, and the like, without being limited thereto. It is possible to appropriately perform these optional steps before or after step (i) and step (ii) as necessary.

Example of Manufacturing Ruthenium Wiring Applying FSAV

With reference to FIGS. 1 to 5 below, examples of manufacturing a ruthenium wiring applying FSAV are listed, but the manufacturing method of the present embodiment is not limited thereto.

First, as shown in FIG. 1, an insulating film 5 having a trench 1 is formed on a substrate 3 via an underlayer 4. It is possible to form the substrate 3 to be, for example, a semiconductor substrate on which one or a plurality of semiconductor treatment chambers are formed. As the underlayer 4, for example, it is possible to use silicon nitride (SiN), silicon carbon nitride (SiCN), silicon carbide (SiC), aluminum oxide (AlOx), aluminum nitride (AlN), oxide doped carbon (ODC), and the like. It is possible for the insulating film 5 to be, for example, an oxide film, or a low-k layer, and to be formed by, for example, SiOCH, doped silicon dioxide (fluorine, carbon and other dopants), spin-on polymers (including organic and silicon-based polymers), porous oxides, and the like. It is possible to form the trench 1 by known etching methods or the like.

Figure 2:
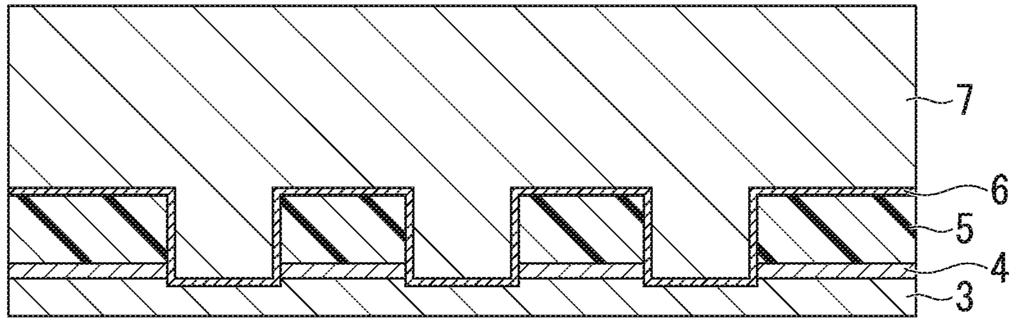
FIG. 2 is a schematic diagram illustrating an example of a step of a method for manufacturing a ruthenium wiring to which it is possible to apply the method of one embodiment of the present invention.

Next, as shown in FIG. 2, after a barrier layer or a liner layer 6 is provided, a ruthenium-containing layer 7 is formed using a conductive material including ruthenium to fill in the trench 1. The method for forming the ruthenium-containing layer 7 is not particularly limited and it is possible to use a known film forming method such as the CVD method. It is possible to form a barrier layer or a liner layer, for example, by titanium nitride (TiN) or the like.

Figure 3:
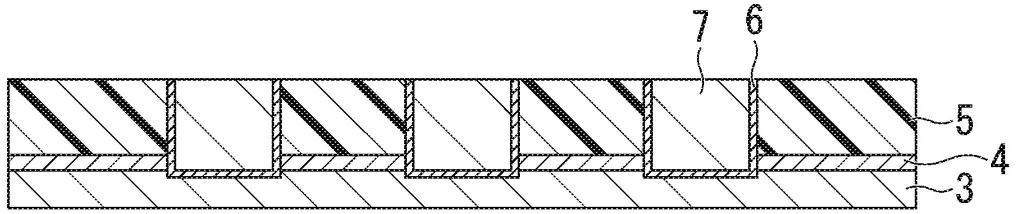
FIG. 3 is a schematic diagram illustrating an example of a step of a method for manufacturing a ruthenium wiring to which it is possible to apply the method of one embodiment of the present invention.

Next, as shown in FIG. 3, the surface is planarized by polishing the ruthenium-containing layer 7 by CMP or the like until a convex portion of the insulating film 5 is exposed.

Figure 4:
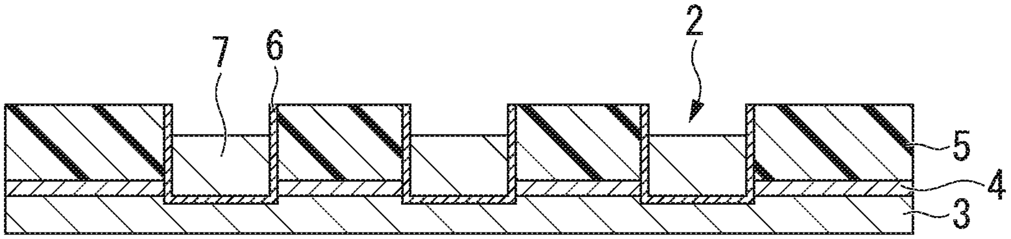
FIG. 4 is a schematic diagram illustrating an example of a step of a method for manufacturing a ruthenium wiring to which it is possible to apply the method of one embodiment of the present invention.

Next, as shown in FIG. 4, the cycle of step (i) and step (ii) above is repeated to etch the ruthenium-containing layer 7 to form a recess 2 with a desired depth. The depth of the recess 2 is not particularly limited, but, for example, 1 nm to 20 nm, 2 nm to 15 nm, 3 nm to 12 nm, or the like is possible. The number of repetitions of step (i) and step (ii) is not particularly limited and is able to be set to the number of times at which the recess 2 has the desired depth. Due to this, it is possible to form a ruthenium wiring with the ruthenium-containing layer 7.

Figure 5:
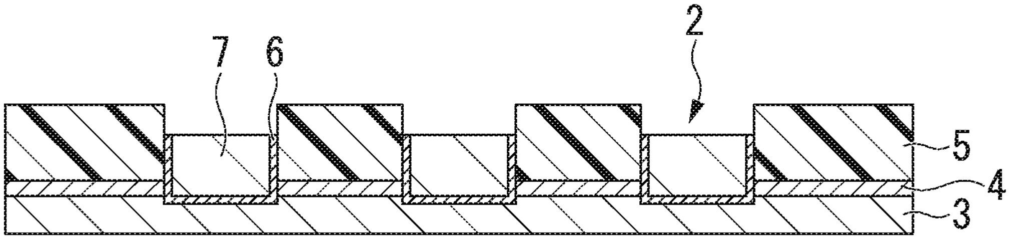
FIG. 5 is a diagram illustrating a step of a method for manufacturing a ruthenium wiring to which it is possible to apply the method of one embodiment of the present invention.

Next, as shown in FIG. 5, the barrier layer or the liner layer 6 exposed in the recess 2 is removed. It is possible to perform the removal of the barrier layer or the liner layer 6 using hydrogen peroxide, SC-1 (a mixed solution of hydrogen peroxide and ammonia), and the like.

A description was given above of an example of manufacturing a ruthenium wiring by applying FSAV; however, it is possible to apply the manufacturing method of the present embodiment to other wiring forming methods without being particularly limited.

According to the manufacturing method for a ruthenium wiring of the present embodiment described above, step (i) is performed before the etching treatment of step (ii). Due to this, it is possible to suppress intergranular corrosion during etching and to form a ruthenium wiring with reduced surface roughness while maintaining a good etching rate.

EXAMPLES

A more detailed description will be given below of the present invention using Examples, but the present invention is not limited by these Examples.

<Treatment of Substrate Including Ruthenium>

(Preparation of Object to be Treated)

A ruthenium film with a film thickness of 30 nm was formed on a 12-inch silicon wafer by the CVD method and used as an object to be treated.

(Step (i))

The object to be treated was immersed in each chemical solution shown in Table 1 and stirring was carried out to perform a treatment on the object to be treated. The treatment temperature and treatment time are shown in Table 1. After treatment, the object to be treated was taken out from the chemical solution and cleaned with water.

(Step (ii))

After cleaning with water in step (i), the object to be treated was immersed in the etching solution shown in Table 1 and stirring was carried out to perform an etching treatment on the object to be treated. The treatment temperature and treatment time are shown in Table 1. After the treatment, the object to be treated was taken out from the etching solution and cleaned with water.

(Repeated Treatment)

Step (i) and step (ii) above were repeated the number of times shown in Table 1. After the repeated treatments, the object to be treated was dried by nitrogen blowing.

TABLE 1

| | Step (i) | | | Step (ii) | | | |
|---|---|---|---|---|---|---|---|
| | Chemical solution | Temperature | Time | Chemical solution | Temperature | Time | Number of repetitions |
| Comparative Example 1 | — | — | — | (E)-1 | Room temperature | 5 minutes | 1 time |
| Comparative Example 2 | (A2)-1 | Room temperature | 1 minute | (E)-1 | Room temperature | 1 minute | 5 times |
| Comparative Example 3 | (A2)-2 | Room temperature | 1 minute | (E)-1 | Room temperature | 1 minute | 5 times |
| Comparative Example 4 | (A2)-3 | Room temperature | 1 minute | (E)-1 | Room temperature | 1 minute | 5 times |
| Example 1 | (A1)-1 | Room temperature | 1 minute | (E)-1 | Room temperature | 1 minute | 5 times |
| Example 2 | (A1)-1 | 50° C. | 1 minute | (E)-1 | Room temperature | 1 minute | 5 times |
| Example 3 | (A1)-2 | Room temperature | 1 minute | (E)-1 | Room temperature | 1 minute | 5 times |
| Example 4 | (A1)-3 | Room temperature | 1 minute | (E)-1 | Room temperature | 1 minute | 5 times |
| Example 5 | (A1)-3 | 50° C. | 1 minute | (E)-1 | Room temperature | 1 minute | 5 times |
| Example 6 | (A1)-4 | Room temperature | 1 minute | (E)-1 | Room temperature | 1 minute | 5 times |
| Example 7 | (A1)-4 | 50° C. | 1 minute | (E)-1 | Room temperature | 1 minute | 5 times |
| Example 8 | (A1)-5 | Room temperature | 1 minute | (E)-1 | Room temperature | 1 minute | 5 times |
| Example 9 | (A1)-6 | Room temperature | 1 minute | (E)-1 | Room temperature | 1 minute | 5 times |
| Example 10 | (A1)-7 | Room temperature | 1 minute | (E)-1 | Room temperature | 1 minute | 5 times |
| Example 11 | (A1)-8 | Room temperature | 1 minute | (E)-1 | Room temperature | 1 minute | 5 times |
| Example 12 | (A1)-9 | Room temperature | 1 minute | (E)-1 | Room temperature | 1 minute | 5 times |
| Example 13 | (A1)-10 | Room temperature | 1 minute | (E)-1 | Room temperature | 1 minute | 5 times |
| Example 14 | (A1)-11 | Room temperature | 1 minute | (E)-1 | Room temperature | 1 minute | 5 times |

TABLE 1-continued

| | Step (i) | | | Step (ii) | | | |
|---|---|---|---|---|---|---|---|
| | Chemical solution | Temperature | Time | Chemical solution | Temperature | Time | Number of repetitions |
| Example 15 | (A1)-12 | Room temperature | 1 minute | (E)-1 | Room temperature | 1 minute | 5 times |
| Example 16 | (A1)-13 | Room temperature | 1 minute | (E)-1 | Room temperature | 1 minute | 5 times |
| Example 17 | (A1)-14 | Room temperature | 1 minute | (E)-1 | Room temperature | 1 minute | 5 times |
| Example 18 | (A1)-15 | Room temperature | 1 minute | (E)-1 | Room temperature | 1 minute | 5 times |

In Table 1, each abbreviation has the following meaning.

(A1)-1: 0.1% by mass 1,2,3-benzotriazole aqueous solution (A1)-2: 0.1% by mass 5-methyl-1H-benzotriazole aqueous solution (A1)-3: 0.1% by mass 1,2,4-triazole aqueous solution (A1)-4: 0.1% by mass 2,2'-bipyridyl aqueous solution (A1)-5: 0.1% by mass 4,4'-dimethyl-2,2'-bipyridyl propylene glycol monomethyl ether (PGME) solution (A1)-6: 0.1% by mass 4,4'-di-tert-butyl-2,2'-bipyridyl PGME solution (A1)-7: 0.1% by mass 4,4'-dinonyl-2,2'-bipyridyl PGME solution (A1)-8: 0.1% by mass 1,10-phenanthroline PGME solution (A1)-9: 0.1% by mass benzimidazole PGME solution (A1)-10: 0.1% by mass 2,2'-biimidazole PGME solution (A1)-11: 0.1% by mass adenine PGME solution (A1)-12: 0.05% by mass octylphosphonic acid PGME solution (A1)-13: 0.05% by mass dodecylphosphonic acid PGME solution (A1)-14: 0.05% by mass octadecylphosphonic acid PGME solution (A1)-15: 0.05% by mass phenylphosphonic acid PGME solution (A2)-1: Water (A2)-2: 1% by mass hydrogen peroxide solution (A2)-3: 0.1% by mass hydrofluoric acid aqueous solution (E)-1: 0.8% by mass orthoperiodic acid aqueous solution (adjusted to pH 9.5 with ammonia)

[Evaluation of Etching Rate]

Test samples were cut from the object to be treated before and after treatment in the <Treatment of Substrate Including Ruthenium> above and the film thickness of the ruthenium film was measured by X-ray fluorescence analysis. The etching rate was calculated from the film thicknesses measured before and after the treatment. This is shown as the "etching rate" in Table 2.

[Evaluation of Increase Amount of Surface Roughness]

The object to be treated was treated in the <Treatment of Substrate Including Ruthenium> above and etched by 10 nm. The surface of the object to be treated before the treatment and after the treatment was observed by an atomic force microscope (AFM; Dimension Icon manufactured by Bruker Japan K.K.) (measuring area: 2 μm×2 μm) and the root mean square roughness (surface roughness) Rq (nm) per 1 μm square was determined. Using the following equation, the amount of roughness increase due to the treatment of the object to be treated was calculated and evaluated based on the following criteria. This is shown in Table 2 as the "amount of roughness increase".

$$\text{Amount of roughness increase } (X) = Rq \text{ after treatment (nm)} - Rq \text{ before treatment (nm)}$$

Evaluation Criteria

A: $X \leq 0.5$ nm

B: $0.5 \text{ nm} < X \leq 1.0$ nm

C: $X > 1.0$ nm

TABLE 2

| | Etching rate [Å/min] | Amount of roughness increase |
|---|---|---|
| Comparative Example 1 | 20 | C |
| Comparative Example 2 | 20 | C |
| Comparative Example 3 | 20 | C |
| Comparative Example 4 | 20 | C |
| Example 1 | 18 | B |
| Example 2 | 16 | A |
| Example 3 | 18 | B |
| Example 4 | 19 | B |
| Example 5 | 18 | A |
| Example 6 | 18 | B |
| Example 7 | 15 | A |
| Example 8 | 19 | B |
| Example 9 | 19 | B |
| Example 10 | 15 | A |
| Example 11 | 18 | B |
| Example 12 | 18 | B |
| Example 13 | 18 | B |
| Example 14 | 20 | B |
| Example 15 | 19 | B |
| Example 16 | 19 | A |
| Example 17 | 12 | A |
| Example 18 | 19 | B |

As is clear from Table 2, the amount of roughness increase was suppressed in Examples 1 to 18 in comparison with Comparative Examples 1 to 4. In addition, the etching rate was also good.

From the above, it was confirmed that, according to the method of the Examples in which the present invention was applied, it is possible to provide a method for manufacturing a ruthenium wiring which is able to reduce surface roughness and which has a good etching rate.

While preferred embodiments of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

EXPLANATION OF REFERENCES

1 TRENCH
2 RECESS
3 SUBSTRATE
4 UNDERLAYER
5 INSULATING FILM
6 BARRIER LAYER OR LINER LAYER
7 RUTHENIUM-CONTAINING LAYER

What is claimed is:

1. A method for manufacturing a ruthenium wiring, the method comprising the following (i), (i)' and (ii) in this order:

(i) treating a metal surface including ruthenium using a first chemical solution comprising a compound having a functional group capable of coordinating to a ruthenium atom, (i)' cleaning the metal surface including ruthenium using a cleaning solution; and (ii) carrying out an etching treatment on the metal surface including ruthenium treated with the first chemical solution, using a second chemical solution.

2. The method for manufacturing a ruthenium wiring according to claim 1, wherein a cycle of (i), (i)' and (ii) is repeated two or more times.

3. The method for manufacturing a ruthenium wiring according to claim 1, wherein the second chemical solution comprises orthoperiodic acid.

4. The method for manufacturing a ruthenium wiring according to claim 3, wherein the second chemical solution further comprises ammonia.

5. The method for manufacturing a ruthenium wiring according to claim 1, wherein a pH of the second chemical solution is 8 or higher and 10 or lower.

6. The method for manufacturing a ruthenium wiring according to claim 1, wherein the compound included in the first chemical solution is at least one selected from the group consisting of a nitrogen-containing heterocyclic compound and an organic phosphonic acid.

7. The method for manufacturing a ruthenium wiring according to claim 1, the method further comprising cleaning the metal surface including ruthenium before (i).

* * * * *